(12) United States Patent
Kao et al.

(10) Patent No.: US 9,048,162 B2
(45) Date of Patent: Jun. 2, 2015

(54) CMOS IMAGE SENSORS AND METHODS FOR FORMING THE SAME

(75) Inventors: Min-Feng Kao, Chiayi (TW); Dun-Nian Yaung, Taipei (TW); Jen-Cheng Liu, Hsin-Chu (TW); Chun-Chieh Chuang, Tainan (TW); Hsiao-Hui Tseng, Tainan (TW); Tzu-Hsuan Hsu, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/615,071

(22) Filed: Sep. 13, 2012

(65) Prior Publication Data
US 2013/0320420 A1   Dec. 5, 2013

Related U.S. Application Data

(60) Provisional application No. 61/653,748, filed on May 31, 2012.

(51) Int. Cl.
| | |
|---|---|
| *H01L 31/02* | (2006.01) |
| *H01L 27/146* | (2006.01) |
| *H01L 31/18* | (2006.01) |
| *H01L 31/103* | (2006.01) |

(52) U.S. Cl.
CPC .......... *H01L 27/14689* (2013.01); *H01L 31/02* (2013.01); *H01L 31/18* (2013.01); *H01L 31/103* (2013.01); *H01L 31/1804* (2013.01); *H01L 27/1461* (2013.01); *H01L 27/14621* (2013.01); *H01L 27/14627* (2013.01); *H01L 27/1464* (2013.01); *Y02E 10/547* (2013.01)

USPC .......... 257/292; 257/432; 257/290; 257/461; 257/463

(58) Field of Classification Search
CPC .. H01L 31/02; H01L 31/0232; H01L 29/8611
USPC .......... 257/290–294, 432, 461, 463
See application file for complete search history.

(56) References Cited

U.S. PATENT DOCUMENTS

| | | | |
|---|---|---|---|
| 8,329,497 B2 * | 12/2012 | Qian et al. | 438/69 |
| 8,598,638 B2 | 12/2013 | Kenichi | |
| 2011/0298078 A1 * | 12/2011 | Ha et al. | 257/443 |

FOREIGN PATENT DOCUMENTS

| | | |
|---|---|---|
| JP | 2011082425 | 4/2011 |
| KR | 20070017794 | 2/2007 |
| KR | 1020100105442 | 9/2010 |
| WO | 2011043068 | 4/2011 |

* cited by examiner

*Primary Examiner* — Tran Tran
(74) *Attorney, Agent, or Firm* — Slater and Matsil, L.L.P.

(57) ABSTRACT

A device includes a diode, which includes a first, a second, and a third doped region in a semiconductor substrate. The first doped region is of a first conductivity type, and has a first impurity concentration. The second doped region is of the first conductivity type, and has a second impurity concentration lower than the first impurity concentration. The second doped region encircles the first doped region. The third doped region is of a second conductivity type opposite the first conductivity type, wherein the third doped region overlaps a portion of the first doped region and a portion of the second doped region.

20 Claims, 12 Drawing Sheets

CMOS IMAGE SENSORS AND METHODS FOR FORMING THE SAME

This application claims the benefit of the following provisionally filed U.S. Patent application: Application Ser. No. 61/653,748, filed May 31, 2012, and entitled "CMOS Image Sensor and Methods of Manufacturing Same;" which application is hereby incorporated herein by reference.

BACKGROUND

Image sensor chips, which include front side image sensor chips and Backside Illumination (BSI) image sensor chips, are widely used in applications such as cameras. In the formation of image sensor chips, image sensors (such as photo diodes) and logic circuits are formed on a silicon substrate of a wafer, followed by the formation of an interconnect structure on a front side of the wafer. In the front side image sensor chips, color filters and micro-lenses are formed over the interconnector structure. In the formation of the BSI image sensor chips, after the formation of the interconnect structure, the wafer is thinned, and backside structures such as color filters and micro-lenses are formed on the backside of the silicon substrate. When the image sensor chips are used, light is projected on the image sensors, in which the light is converted into electrical signals.

The image sensors in the image sensor chips generate electrical signals in response to the stimulation of photons. The full well capacity and the signal-to-noise ratio of the image sensors are preferably high. To increase the full well capacity and the signal-to-noise ratio of the image sensors such as photo diodes, the impurity concentrations of the p-type and/or n-type regions of the photo diodes may be increased. Such increase, however, results in the degradation of some other performance of the image sensors. For example, the dark current and white pixel performance may be adversely increased due to the increase in the impurity concentrations. Furthermore, the leakage currents of the photo diodes may be increased due to higher impurity concentrations, wherein the leakage currents occur between the photo diodes and the adjacent isolation regions.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Methods of forming image sensor wafers/chips are provided in accordance with various embodiments. The intermediate stages in the formation of the image sensor wafers/chips are illustrated. The variations of the embodiments are discussed. Throughout the various views and illustrative embodiments, like reference numbers are used to designate like elements.

Figure 1:
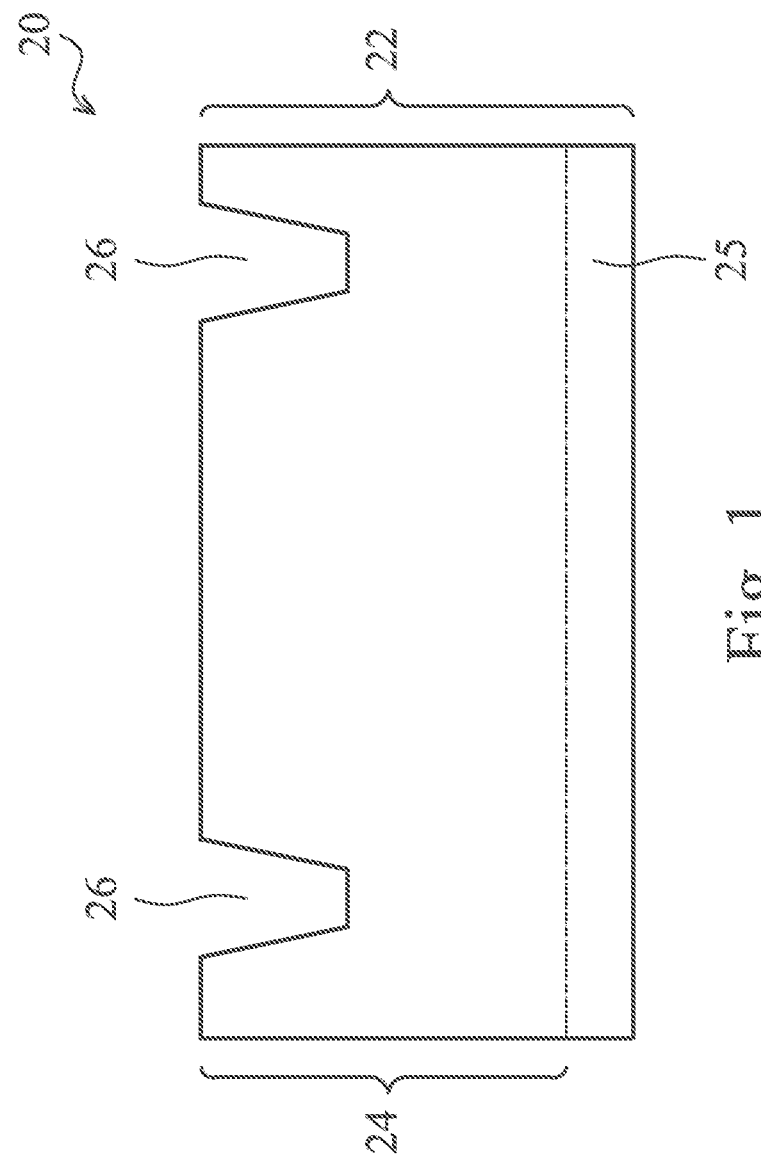
FIGS. 1 through 11 are cross-sectional views and top views of intermediate stages in the manufacturing of an image sensor wafer in accordance with various embodiments.

FIG. 1 illustrates image sensor wafer 20, which includes semiconductor substrate 22. In some embodiments, semiconductor substrate 22 is a crystalline silicon substrate. Alternatively, semiconductor substrate 22 is formed of other semiconductor materials such as silicon germanium, silicon carbon, a III-V compound semiconductor material, and the like. In some embodiments, substrate 22 includes doped region 24, which may be lightly doped to p-type. Furthermore, doped region 24 may be an epitaxy region that is grown on an original substrate 25, with the p-type impurity in-situ doped during the epitaxy. Alternatively, doped region 24 may be formed by implantation. In some embodiments, doped region 24 is a lightly doped p-type (P−) region having a p-type concentration between about $10^{14}/cm^3$ and about $10^{17}/cm^3$, for example. Trenches 26 are formed to extend from the top surface of substrate 22 into substrate 22.

Figure 2:
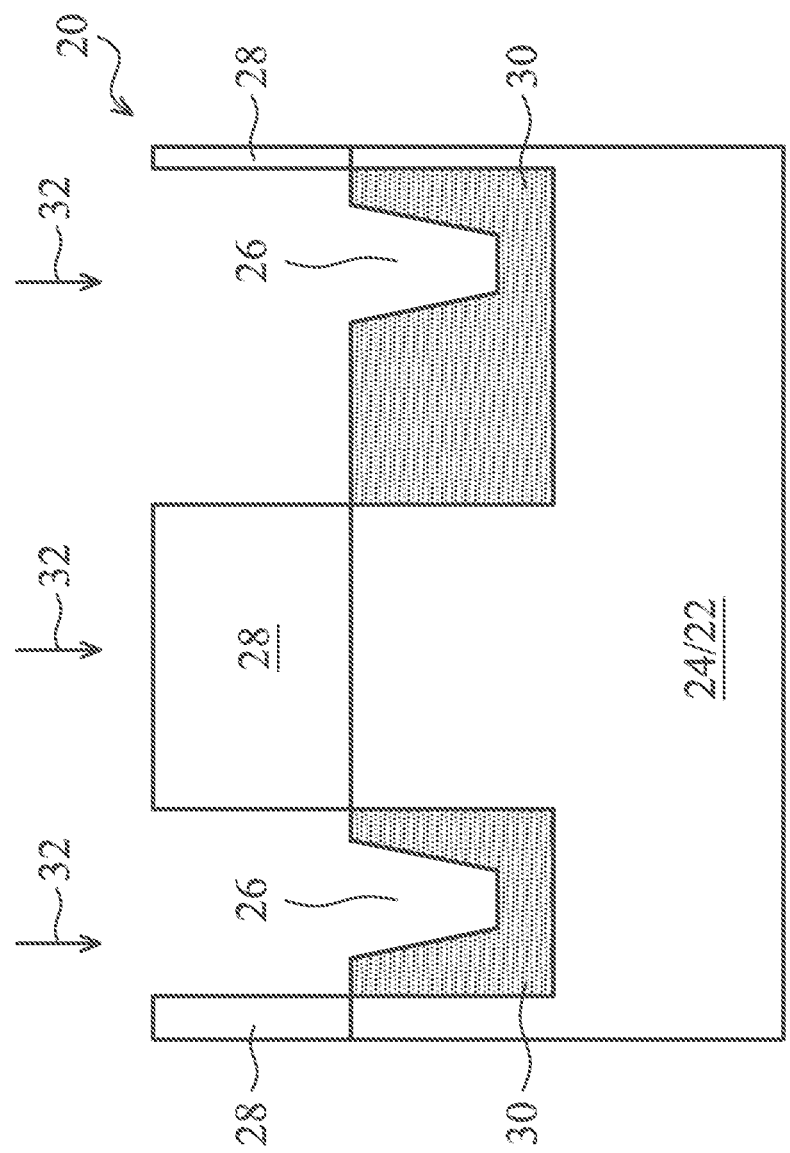

Next, referring to FIG. 2, photo resist 28 is formed and patterned, and trenches 26 may be exposed through the openings in photo resist 28. An implantation or a plurality of implantations 32 is then performed using photo resist 28 as an implantation mask. During the implantation, a p-type impurity is implanted into substrate 22, so that p-type regions 30 are formed. Although p-type regions 30 appear to be discrete regions that are separate from each other in FIG. 2, the discrete regions 30 may be portions of an integrate region, as shown in the top view in FIG. 5B. P-type regions 30 are also referred to as a Field (area) Light Doping (FLD) region. P-type regions 30 may have a p-type impurity concentration between about $10^{14}/cm^3$ and about $10^{20}/cm^3$, for example. After the formation of p-type regions 30, photo resist 28 is removed.

Figure 3:
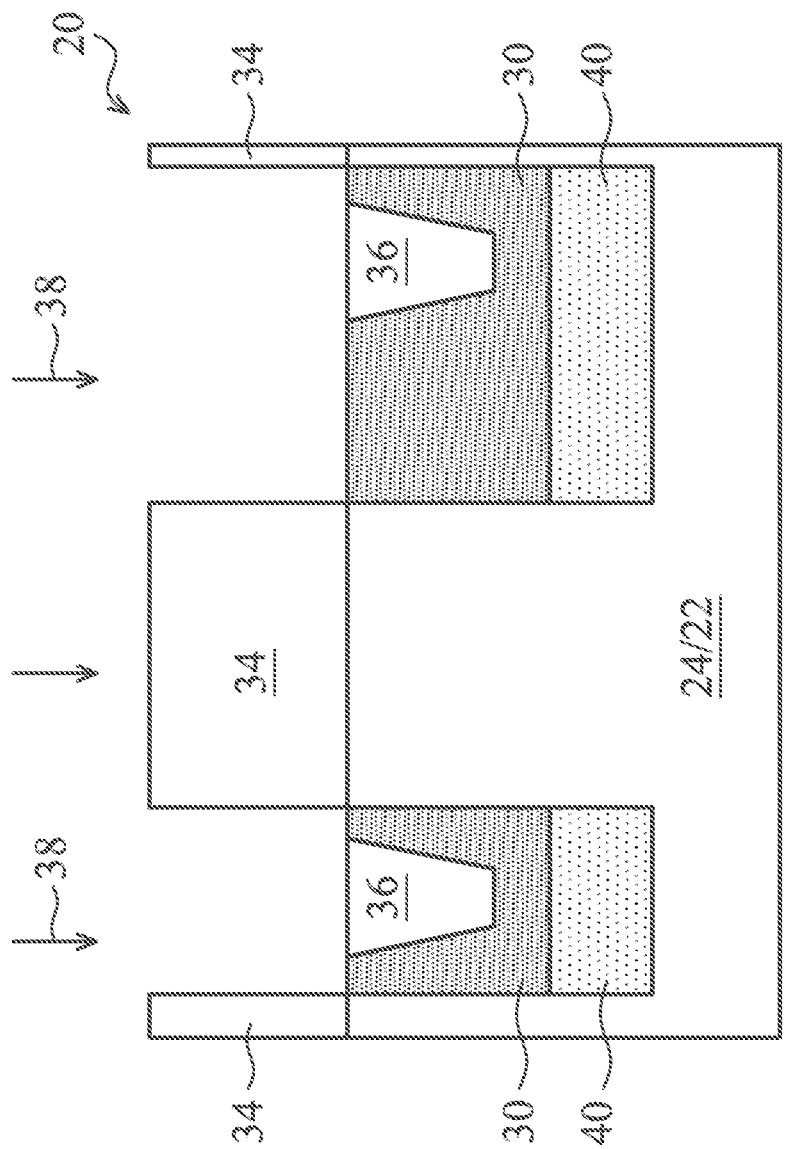

FIG. 3 illustrates the formation of isolation regions 36 and deep well regions 40. Isolation regions 36 are also referred to as Shallow Trench Isolation (STI) regions 36 hereinafter. The formation of STI regions 36 may include filling a dielectric material into trenches 26 (FIG. 2), and then performing a Chemical Mechanical Polish (CMP) to remove excess portions of the dielectric material, which excess portions are over substrate 22. The remaining portions of the dielectric material form STI regions 36.

Next, photo resist 34 is formed and patterned. STI regions 36 may be exposed through the openings in photo resist 34. An implantation or a plurality of implantations 38 is then performed to implant a p-type impurity into substrate 22, so that deep well regions 40 are formed. Deep well regions 40 may have a p-type impurity concentration between about $10^{14}/cm^3$ and about $10^{20}/cm^3$, for example. Deep well regions 40 are underlying P-type regions 30. P-type regions 30 and deep well regions 40 are also referred to as semiconductor isolation regions hereinafter. Photo resist 34 is then removed.

Figure 4:
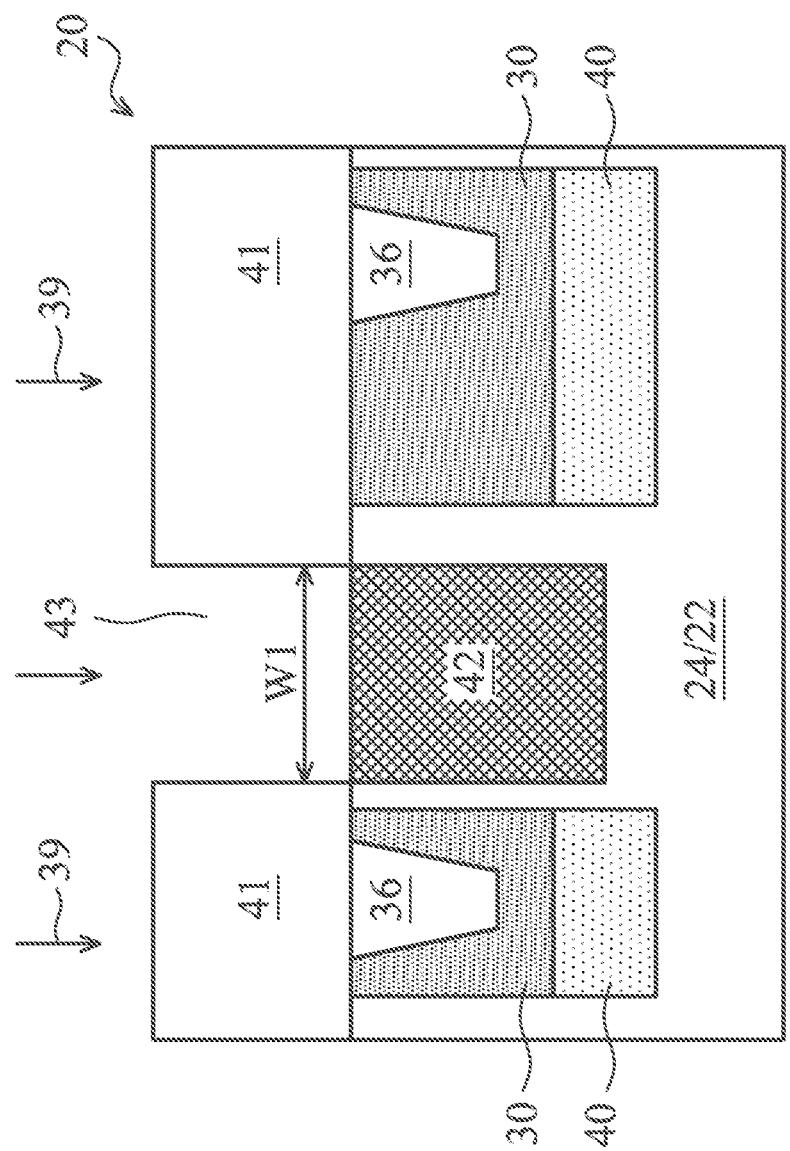

Next, referring to FIG. 4, n-type region 42 is formed. The formation process includes forming and patterning photo resist 41, implanting (symbolized by arrows 39) an n-type impurity into doped region 24, and then removing photo resist 41. Although one photo resist 41 is illustrated, the formation of n-type region 42 may include forming and removing a plurality photo resists, and performing one or a plurality of n-type implantations using each of the photo resists as an implantation mask. By using more than one photo resist 41, the profile of n-type region 42 may be adjusted. For example, when the openings 43 in the plurality of photo resists 41 have different sizes, the sidewalls of n-type region 42 may be slanted, and the lower portions of n-type region 42 may be either narrower or wider than the upper portions. N-type region 42 may have a substantially uniform n-type impurity concentration throughout different depths, which means that the top portion, the middle portion, and the bottom portion of n-type region 42 may have n-type impurity concentrations close to each other. For example, a ratio between the highest n-type impurity concentration to the lowest n-type impurity concentration in n-type region 42 may be smaller than 10. In some exemplary embodiments, n-type region 42 may have an n-type impurity concentration between about $10^{12}/cm^3$ and about $10^{18}/cm^3$, for example. Photo resist 41 is removed after the formation of n-type region 42.

Figure 5A:
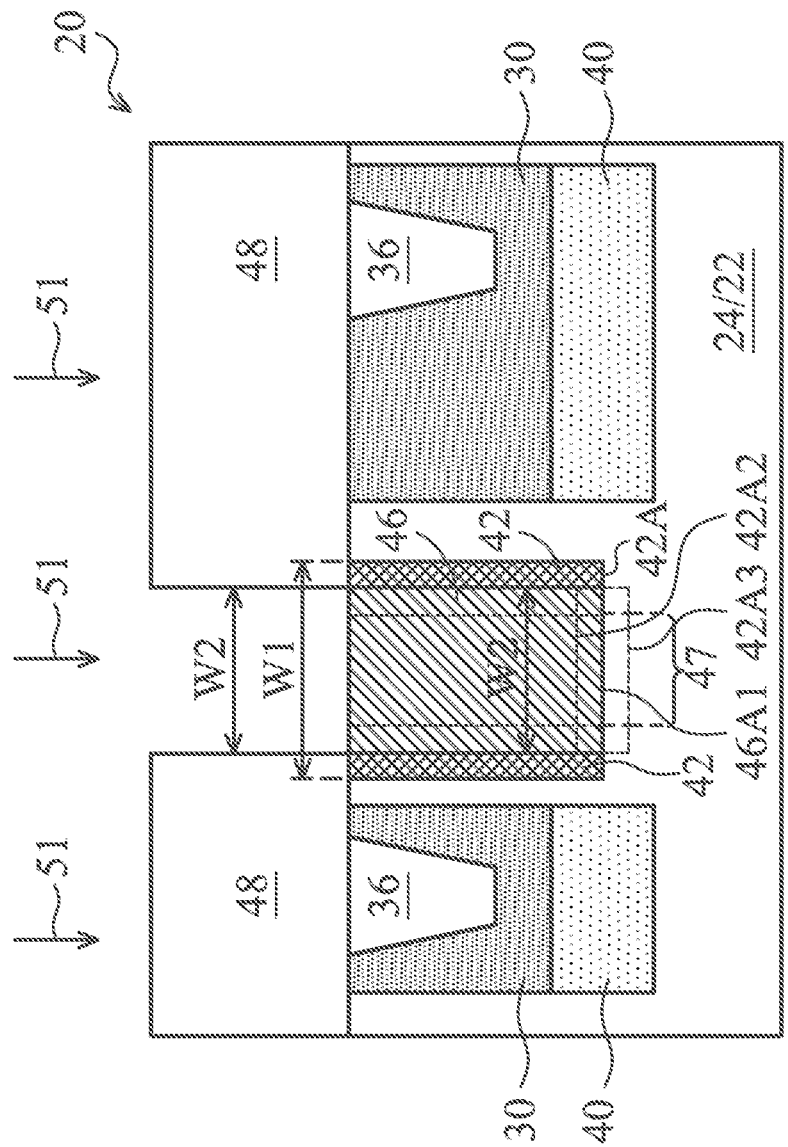

FIG. 5A illustrates the formation of n-type region 46. The formation process includes forming and patterning photo resist 48, implanting (symbolized by arrows 51) an n-type impurity into doped region 24, and then removing photo resist 48. Although one photo resist 48 is illustrated, the formation of n-type region 46 may also include forming and removing a plurality photo resists, and performing one or a plurality of n-type implantations using each of the photo resists. N-type region 46 may have a substantially uniform n-type impurity concentration throughout different depths, which means that the top portion, the middle portion, and the bottom portion of n-type region 46 may have n-type impurity concentrations close to each other. For example, a ratio between the highest n-type impurity concentration to the lowest n-type impurity concentration in n-type region 46 may be smaller than 10. Furthermore, n-type region 46 may have an n-type impurity concentration between about $10^{13}/cm^3$ and about $10^{19}/cm^3$, which is higher than the n-type impurity concentration in n-type region 42.

In some embodiments, bottom surface 46A1 of n-type region 46 is substantially level with bottom surface 42A of n-type region 42. In alternative embodiments, the bottom surface of n-type region 46 is at the position illustrated as 46A2, which is higher than bottom surface 42A of n-type region 42. In yet alternative embodiments, the bottom surface of n-type region 46 is at the position illustrated as 46A3, which is lower than bottom surface 42A of n-type region 42. Furthermore, lateral dimension W2 of n-type region 46 is smaller than the respective lateral dimension W1 of n-type region 46. Lateral dimension W1 and W2 are also the lateral dimensions of the openings in photo resists 41 and 48, respectively, as illustrated in FIGS. 4 and 5A, respectively.

In some embodiments, an additional n-type region 47 is formed through an additional implantation (using an additional implantation mask, which is not shown). N-type region 47 may be encircled by n-type region 46. The n-type impurity concentration of n-type region 47 is also higher than the n-type impurity concentration of n-type region 46. In alternative embodiments, n-type region 47 is not formed. In yet other embodiments, besides n-type region 47, an additional n-type region (not shown) may be formed, and encircled by n-type region 47. The additional n-type region may also have an n-type impurity concentration higher than the n-type impurity concentration of n-type region 47.

Figure 5B:
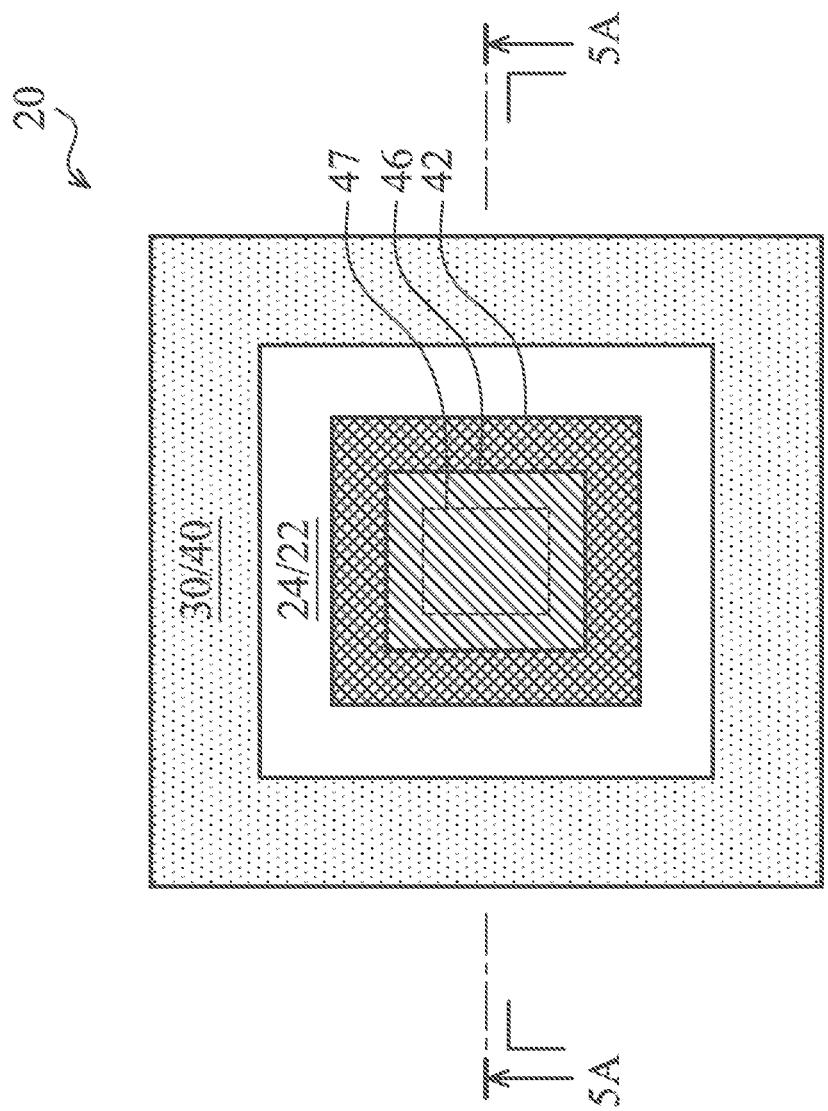

FIG. 5B illustrates a cross-sectional view of the structure in FIG. 5A, wherein the cross-sectional view in FIG. 5A is obtained from the plane crossing line 5A-5A in FIG. 5B. In the top view of n-type regions 42 and 46, n-type region 42 encircles n-type region 46. In some embodiments, as shown in FIG. 5B, n-type regions 42 and 46 have rectangular top-view shapes. In alternative embodiments, n-type regions 42 and 46 may have any other applicable top-view shapes including, and not limited to, circular shapes, hexagons, octagons, or the like. As shown in FIG. 5B, n-type regions 42 and 46 in combination form a combined n-type region, wherein n-type region 46 forms the inner portion of the n-type region, and n-type region 42 forms the outer portion of the combined n-type region.

In subsequent manufacturing processes, there may be some thermal processes, which cause the impurities in n-type regions 42 and 46 to out-diffuse. After the out-diffusing, however, there is still a substantial abrupt transition from the impurity concentration of n-type region 42 to the impurity concentration of n-type region 46, and hence n-type regions 42 and 46 may be distinguished as being separately formed regions that are doped with different impurity concentrations.

Figure 6:
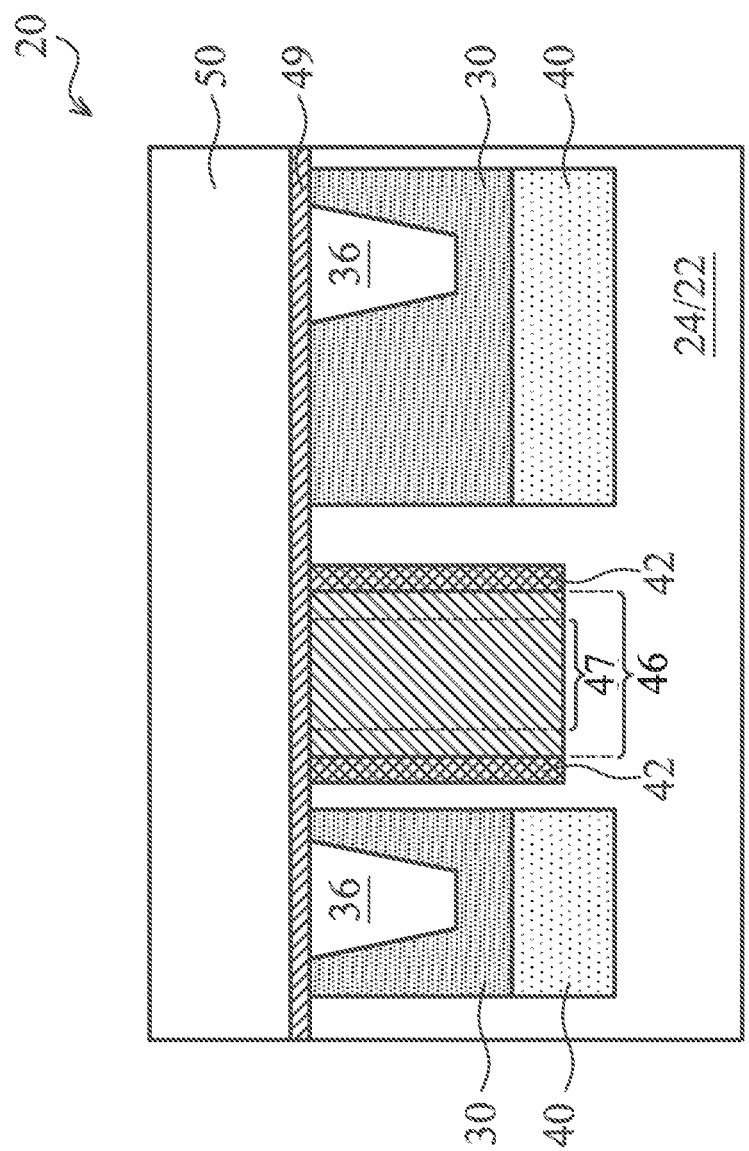

Referring to FIG. 6, gate dielectric layer 49 and gate electrode layer 50 are formed over substrate 22 and doped regions 30, 42, and 46. Gate dielectric layer 49 may include an oxide, a nitride, an oxynitride, a carbide, combinations thereof, and/or multi-layers thereof. Gate electrode layer 50 is conductive or semi-conductive. In some embodiments, electrode layer 50 is formed of polysilicon. In alternative embodiments, gate electrode layer 50 is formed of other conductive materials such as metals, metal silicides, metal nitrides, or combinations thereof.

Figure 7:
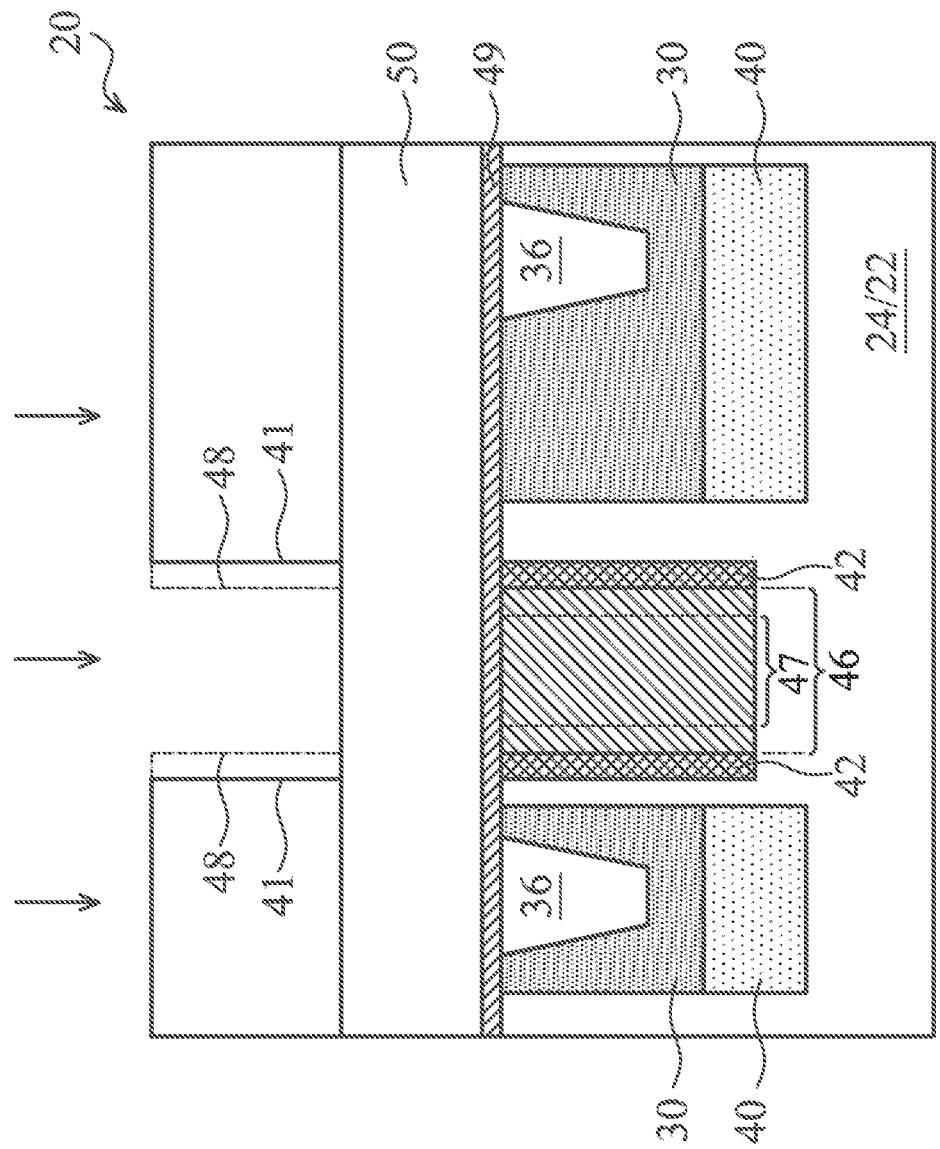

FIG. 7 illustrates the formation of n-type regions 42 and 46 in accordance with alternative embodiments. In these embodiments, the formation of n-type regions 42, 46, and 47 is performed after the formation of gate dielectric layer 49 and gate electrode layer 50. The implanted n-type impurities thus penetrate through gate dielectric layer 49 and gate electrode layer 50 to form n-type regions 42, 46, and 47. The respective photo resists 41 and 48 used for implantation are also schematically illustrated. Although photo resists 41 and 48 are shown in the same cross-sectional views, they are formed at different times.

Figure 8:
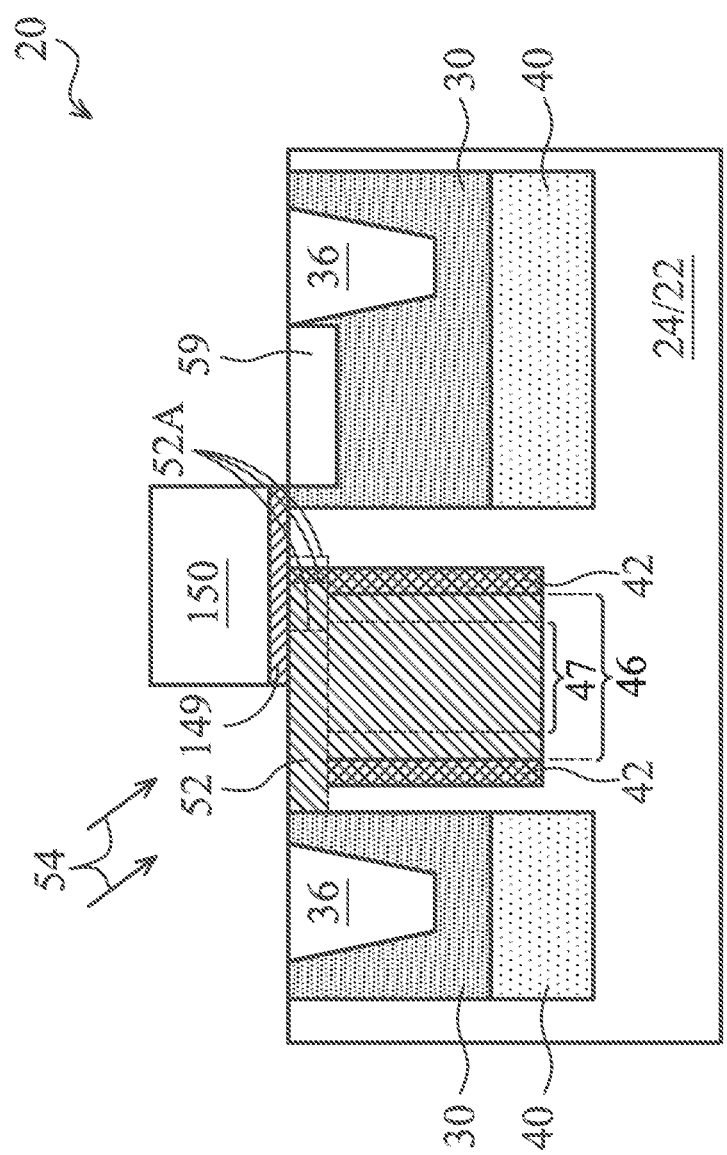

Gate dielectric layer 49 and gate electrode layer 50 are patterned to form gate dielectric 149 and gate electrode 150, respectively. The resulting structure is shown in FIG. 8. In some embodiments, an n-type implantation 54 is performed to form n-type region 52, which is a surface layer of substrate 22. During the n-type implantation 54, a surface portion of n-type region 42 and a surface portion of n-type region 46 are further implanted to form n-type region 52. The implantation 54 is tilted, so that n-type region 52 extends to underlying and overlapped by gate electrode 150. In the respective structure, n-type region 52 overlaps the illustrated left portion of n-type region 42 and some portions of n-type region 46. N-type region 52 may have an impurity concentration greater than the impurity concentration of n-type regions 42 and 46. N-type region 52 may also overlap some or an entirety of the illustrated right portion of n-type region 46, wherein dashed lines 52A illustrate the possible positions of the right edges of n-type region 52 in accordance with various embodiments. In alternative embodiments, n-type region 52 is not formed, and the subsequently formed p-type region 56 (FIG. 9) is in contact with n-type regions 42 and 46.

Figure 9:
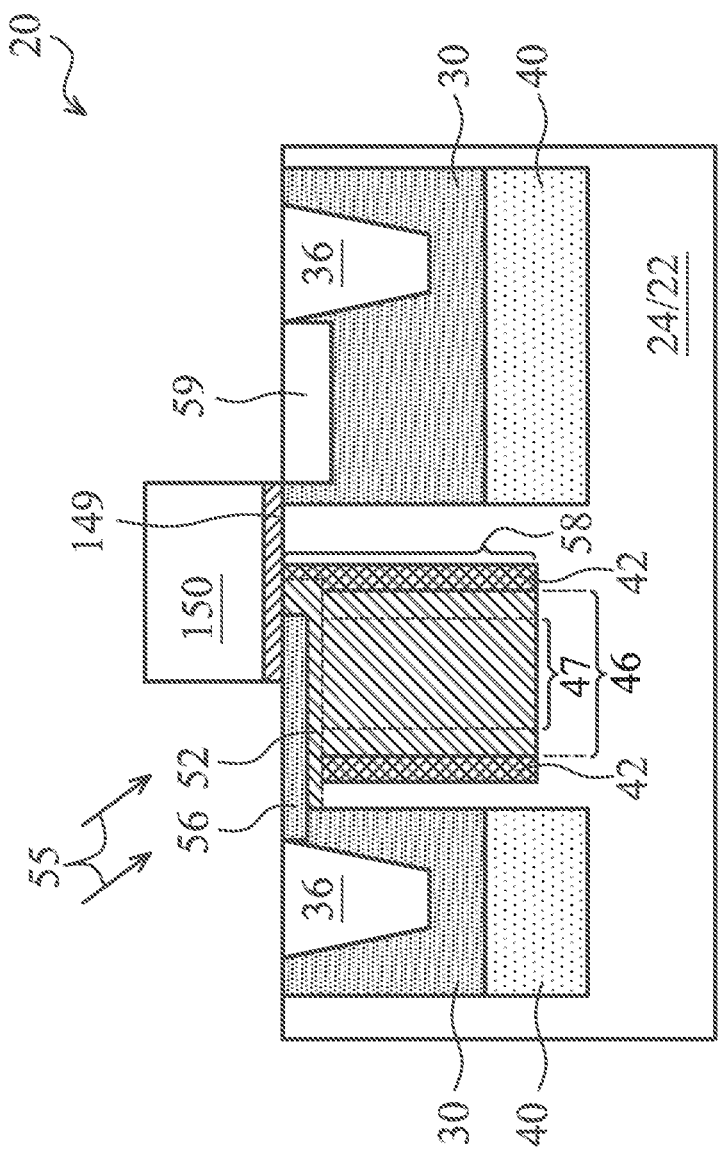

Referring to FIG. 9, a p-type implantation 55 is performed to form p-type region 56, which is overlying and contacting n-type region 52. In the embodiments n-type region 52 is not formed, p-type region 56 is over and contacting n-type regions 42 and 46. The left edge of the p-type region 56 is in contact, and may extend into p-type region 30. The p-type implantation may be vertical, so that the right edge of p-type region 56 is aligned to the left edge of gate electrode 150. Alternatively, as illustrated in FIG. 9, the p-type implantation 55 is tilted, so that p-type region 56 extends underlying and overlapped by gate electrode 150. Photo diode 58 is thus formed. Photo diode 58 includes p-type region 56 as the p-side of the photo diode 58, and n-type regions 42 and 46 (and n-type region 52 when formed) as the n-side of photo diode 58. The n-side of photo diode 58 forms the p-n junction with the p-side. In addition, n-type extension region 59 (a lightly doped drain/source region) may also be formed through an implantation step.

Figure 10:
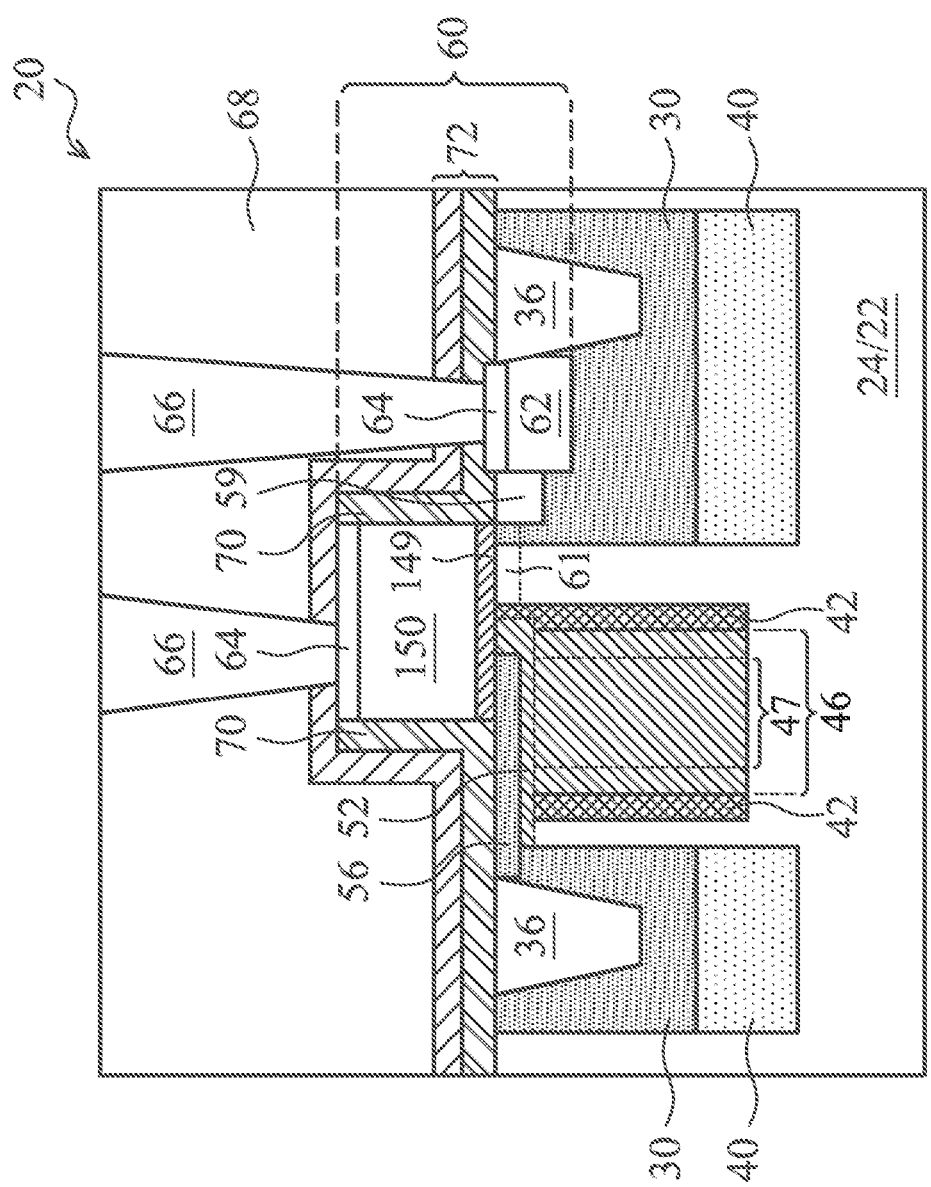

FIG. 10 illustrates the formation of the remaining portions of transistor 60 that has gate dielectric 149 and gate electrode 150 as the gate stack. The remaining portions of transistor 60 further include heavily doped n-type region 62, silicide regions 64, and gate spacers 70. Heavily doped n-type region 62 is a source or drain region (referred to as source/drain region hereinafter) of transistor 60. In addition, contact plugs 66, Inter-Layer Dielectric (ILD) 68, Resist Protective oxide (RPO) and Contact Etch Stop Layer (CESL) 72, etc., are also formed.

In the resulting structure in FIG. 10, portion 61 of doped region 24 forms the channel region of transistor 60. Photo diode 58 and transistor 60 act as the photo diode and the transfer gate transistor of a same image sensor unit. When transistor 60 is turned on, channel 61 acts as the electrical connection between photo diode 58 and source/drain region 62. The charges generate by photo diode 58 may thus flow through channel 61 to source/drain region 62, from which the charges may be collected and processed as the electrical signals of the respective image sensor unit. When transistor 60 is turned off, the electrical connection between photo diode 58 and source/drain region 62 is disconnected.

Figure 11:
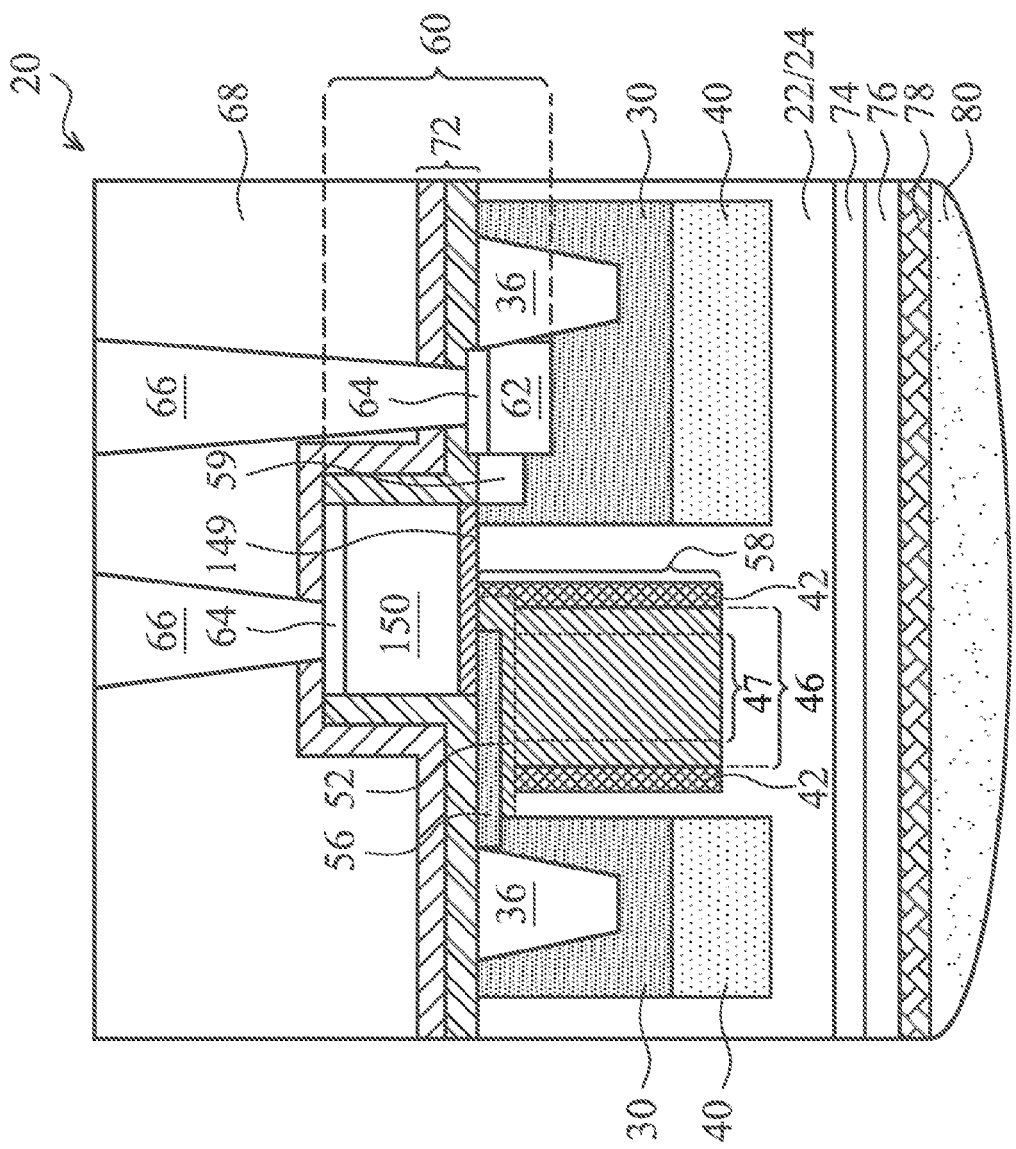

In accordance with some embodiments, as shown in FIG. 11, some backside processes may be performed to form wafer 20 as a Backside Illumination (BSI) image sensor wafer, which includes a plurality of image sensor chips therein. The processes include thinning substrate 22 from the backside, forming heavily dope p-type layer 74, forming BSI film stacks 76 (which may include oxide layers, anti-reflective layers, metal grids, or the like), forming color filters 78, and forming micro-lenses 80. In alternative embodiments (not shown), process steps are continued to form a front side illumination image sensor wafer from the structure in FIG. 11, wherein metal layers (not shown), color filters 78, and micro-lenses 80 are formed over the illustrated structure in FIG. 10.

Although the impurity type of the doped semiconductor regions (such as regions 30, 40, 42, 46, 47, 52, 56, etc.) are specified in the illustrated embodiments, the teaching of the embodiments is readily available for the formation of a device with conductivity types of these doped semiconductor regions inverted.

In the embodiments, the n-type region of photo diode 58 includes inner portion 46 (FIG. 11) and outer portion 42 encircling inner portion 46, wherein outer portion 42 has a lower impurity concentration than inner portion 46. Accordingly, the leakage from photo diode 58 to semiconductor isolation regions 30 and 40 (FIG. 11) is reduced. On the other hand, since outer portion 42 has a low impurity concentration, the p-type impurity concentration of p-type regions 30 and 40 can be reduced, which result in an improved dark current and white pixel performance. The high impurity concentration of inner portion 46 also results in the full well capacity and the signal-to-noise ratio of the respective image sensors to be high.

In accordance with embodiments, a device includes a diode, which includes a first, a second, and a third doped region in a semiconductor substrate. The first doped region is of a first conductivity type, and has a first impurity concentration. The second doped region is of the first conductivity type, and has a second impurity concentration lower than the first impurity concentration. The second doped region encircles the first doped region. The third doped region is of a second conductivity type opposite the first conductivity type, wherein the third doped region overlaps a portion of the first doped region and a portion of the second doped region.

In accordance with other embodiments, a device includes a semiconductor substrate, a gate dielectric overlying the semiconductor substrate, and a gate electrode overlying the gate dielectric. A photo diode is disposed in the semiconductor substrate. The photo diode includes a first doped region of a first conductivity type and having a first impurity concentration, and a second doped region of the first conductivity type encircling the first doped region, wherein the second doped region has a second impurity concentration lower than the first impurity concentration. The gate electrode overlaps portions of the first doped region and the second doped region. The diode further includes a third doped region of a second conductivity type opposite the first conductivity type, wherein the third doped region overlaps the first doped region and the second doped region.

In accordance with yet other embodiments, a method includes forming a first implantation mask having a first opening, implanting a first portion of a semiconductor substrate through the first opening to form a first doped region, forming a second implantation mask having a second opening, and implanting a second portion of the semiconductor substrate to form a second doped region. The first portion of the semiconductor substrate is encircled by the second portion of the semiconductor substrate. A surface layer of the semiconductor substrate is implanted to form a third doped region of a conductivity type opposite the conductivity type of the first and the second doped regions, wherein the third doped region forms a diode with the first and the second doped regions.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A device comprising:
a semiconductor substrate; and
a diode comprising:
   a first doped region of a first conductivity type in the semiconductor substrate, wherein the first doped region has a first impurity concentration;
   a second doped region of the first conductivity type in the semiconductor substrate, wherein the second doped region has a second impurity concentration lower than the first impurity concentration, and wherein the second doped region encircles the first doped region; and a third doped region of a second conductivity type opposite the first conductivity type in the semiconductor substrate, wherein the third doped region overlaps a portion of the first doped region and a portion of the second doped region.

2. The device of claim 1 further comprising an image sensor chip comprising the diode, wherein the diode is a photo diode in the image sensor chip.

3. The device of claim 1 further comprising a fourth doped region over and contacting the first and the second doped regions, wherein the third doped region is further overlying and contacting the fourth doped region, and wherein the fourth doped region is of the first conductivity type, and has an impurity concentration higher than the first and the second impurity concentrations.

4. The device of claim 1, wherein the second doped region forms a fully ring encircling the first doped region.

5. The device of claim 1 further comprising:
a gate dielectric overlapping a portion of the first doped region and a portion of the second doped region;
a gate electrode overlying the gate dielectric; and
a heavily doped region adjacent the gate dielectric, wherein the heavily doped region is of the first conductivity type, and is separated from the first and the second doped regions by a channel region of the second conductivity type, and wherein the channel region is overlapped by the gate electrode.

6. The device of claim 1 further comprising a semiconductor isolation region comprising a semiconductor material doped with an impurity of the second conductivity type, wherein the semiconductor isolation region encircles the second doped region.

7. The device of claim 6, wherein the third doped region is in contact with the semiconductor isolation region.

8. A device comprising:
a semiconductor substrate;
a gate dielectric overlying the semiconductor substrate;
a gate electrode overlying the gate dielectric; and
a photo diode in the semiconductor substrate, wherein the photo diode comprises:
a first doped region of a first conductivity type, wherein the first doped region has a first impurity concentration;
a second doped region of the first conductivity type encircling the first doped region, wherein the second doped region has a second impurity concentration lower than the first impurity concentration, and wherein the gate electrode overlaps portions of the first doped region and the second doped region; and
a third doped region of a second conductivity type opposite the first conductivity type, wherein the third doped region overlaps the first doped region and the second doped region.

9. The device of claim 8, wherein the first conductivity type is n-type.

10. The device of claim 8 further comprising a color filter and a micro-lens aligned to the photo diode.

11. The device of claim 8, wherein the second doped region forms a fully ring encircling the first doped region.

12. The device of claim 8, wherein a bottom surface of the first doped region is substantially level with a bottom surface of the second doped region.

13. The device of claim 8, wherein a bottom surface of the first doped region is higher than a bottom surface of the second doped region.

14. The device of claim 8 further comprising a fourth doped region of the first conductivity type overlying and contacting the first and the second doped regions, wherein the fourth doped region is further underlying and contacting the third doped region, and wherein the fourth doped region has an impurity concentration higher than the first and the second impurity concentrations.

15. A device comprising:
a semiconductor substrate comprising a first p-type region;
a gate dielectric overlying the semiconductor substrate;
a gate electrode overlying the gate dielectric; and
a photo diode in the semiconductor substrate, wherein the photo diode comprises:
a first n-type region having a first n-type impurity concentration;
a second n-type region encircling the first n-type region, wherein the second n-type region has a second n-type impurity concentration lower than the first n-type impurity concentration, and wherein the gate electrode overlaps a first portion of each of the first n-type region and the second n-type region; and
a second p-type region over and in contact with the first n-type region and the second n-type region to form a p-n junction, wherein the second p-type region is further over and contacting the first p-type region.

16. The device of claim 15, wherein the second p-type region comprises a first portion overlapped by the gate electrode, and a second portion not overlapped by the gate electrode.

17. The device of claim 15, wherein the second n-type region forms a fully ring encircling the first n-type region.

18. The device of claim 15 further comprising a first Field Light Doping (FLD) region and a second FLD region in the first p-type region, wherein the first FLD region and the second FLD region are further on opposite sides of the gate electrode, and wherein the first FLD region and the second FLD region are p-type regions.

19. The device of claim 15 further comprising a color filter and a micro-lens aligned to the photo diode.

20. The device of claim 19, wherein the color filter and the micro-lens are on an opposite side of the semiconductor substrate than the gate electrode.

* * * * *